(12) United States Patent  
Fan et al.

(10) Patent No.: US 7,923,832 B2  
(45) Date of Patent: Apr. 12, 2011

(54) INTEGRATED CIRCUIT PACKAGE

(75) Inventors: Yu-Cheng Fan, Zhubei (TW); Yin-Te Hsieh, Taipei (TW)

(73) Assignee: National Taipei University of Technology, Taipei (TW)

( * ) Notice: Subject to any disclaimer, the term of this patent is extended or adjusted under 35 U.S.C. 154(b) by 0 days.

(21) Appl. No.: 12/603,941

(22) Filed: Oct. 22, 2009

(65) Prior Publication Data

US 2010/0117211 A1    May 13, 2010

(30) Foreign Application Priority Data

Nov. 13, 2008  (TW) ............................... 97143887 A

(51) Int. Cl.  
    *H01L 23/48*  (2006.01)
(52) U.S. Cl. ....................................... 257/697; 257/686
(58) Field of Classification Search .................. 257/697, 257/693, 686, 777, 723, 724  
See application file for complete search history.

(56) References Cited

U.S. PATENT DOCUMENTS

| 5,662,483 | A  | * | 9/1997 | Park et al. ...................... 439/101 |
| 5,953,214 | A  | * | 9/1999 | Dranchak et al. ............. 361/767 |
| 6,351,392 | B1 | * | 2/2002 | Palaniappa .................... 361/785 |
| 2007/0235856 | A1 | * | 10/2007 | Haba et al. .................... 257/697 |
| 2008/0006924 | A1 | * | 1/2008 | Morita .......................... 257/686 |
| 2008/0099904 | A1 | * | 5/2008 | Chou et al. .................... 257/686 |
| 2009/0113698 | A1 | * | 5/2009 | Love et al. ...................... 29/739 |
| 2010/0032820 | A1 | * | 2/2010 | Bruennert et al. ............. 257/686 |

* cited by examiner

*Primary Examiner* — S. V Clark  
(74) *Attorney, Agent, or Firm* — Banner & Witcoff, Ltd.

(57) ABSTRACT

An integrated circuit package includes a cover plate disposed on a substrate mounted with an integrated circuit chip thereon. The chip is formed with first solder pads coupled respectively and wiredly to pin terminals on the substrate, and second solder pads coupled respectively and wiredly to pinhole terminals in the cover plate, and includes a main circuit unit, a pin transmission unit interconnecting electrically first ports of a main circuit unit and the first solder pads, a pinhole transmission unit interconnecting electrically second ports of the main circuit unit, and a control unit coupled to the pin and pinhole transmission units, and operable to control operation of the pin and pinhole transmission units such that each first port is coupled to a selected first solder pad through the pin transmission unit and that each second port is coupled to a selected second solder pad through the pinhole transmission unit.

14 Claims, 5 Drawing Sheets

INTEGRATED CIRCUIT PACKAGE

CROSS-REFERENCE TO RELATED APPLICATION

This application claims priority of Taiwanese Application No. 097143887, filed on Nov. 13, 2008.

BACKGROUND OF THE INVENTION

1. Field of the Invention

The invention relates to an integrated circuit, more particularly to an integrated circuit package.

2. Description of the Related Art

The design of electronic products has a current trend toward a smaller size. Since such electronic product with a plurality of electronic chips has a limited internal space, integration of the electronic chips is required. One way of integrating a plurality of electronic chips is to integrate the plurality of chips into a single chip, i.e., SOC (System on a Chip). Another way is to package the electronic chips into a single package so as to form a multi-chip module (MCM).

However, since SOC and MCM are of two-dimensional design, a mounting area of integrated multiple chips occupied on a main board of an electronic product cannot be effectively reduced.

In order to effectively reduce the mounting area of the integrated multiple chips, there has been proposed a three-dimensional package. However, such package cannot be varied with requirement, thereby lacking flexibility during use.

SUMMARY OF THE INVENTION

Therefore, an object of the present invention is to provide an integrated circuit package that can overcome the aforesaid drawbacks of the prior art.

According to one aspect of the present invention, an integrated circuit package comprises:

a substrate provided with a number (N) of pin terminals thereon, the pin terminals extending outwardly of the substrate;

a cover plate disposed on the substrate and provided with a number (N) of pinhole terminals therein; and an integrated circuit chip mounted on the substrate, and formed with a first solder pad unit that includes a number (N) of first solder pads coupled respectively and wiredly to the pin terminals, and a second solder pad unit that includes a number (N) of second solder pads coupled respectively and wiredly to the pinhole terminals, the integrated circuit chip including a main circuit unit including a first port unit that includes a number (M) of first ports, where $N-M \geqq 2$, and a second port unit that includes a number (P) of second ports, where $P \leqq N$, a pin transmission unit coupled between the first port unit of the main circuit unit, and the first solder pad unit, a pinhole transmission unit coupled between the second port unit of the main circuit unit, and the second solder pad unit, and a control unit coupled to the pin transmission unit, the pinhole transmission unit and the first solder pad unit, and operable so as to control operation of the pin and pinhole transmission units such that each of the first ports of the first port unit of the main circuit unit is coupled to a selected one of the first solder pads of the first solder unit through the pin transmission unit, and that each of the second ports of the second port unit of the main circuit unit is coupled to a selected one of the second solder pads of the second solder pad unit through the pinhole transmission unit.

According to another aspect of the present invention, an integrated circuit package assembly comprises:

a first integrated circuit package; and a second integrated circuit package stacked detachably on and coupled to the first integrated circuit package.

The first integrated circuit package includes a first substrate provided with a number (N) of first pin terminals thereon, the first pin terminals extending outwardly of the first substrate, a first cover plate disposed on the first substrate, and formed with a number (N) of first through holes each provided with a first pinhole terminal therein, and a first integrated circuit chip mounted on the first substrate, and formed with a first solder pad unit that includes a number (N) of first solder pads coupled respectively and wiredly to the first pin terminals, and a second solder pad unit that includes a number (N) of second solder pads coupled respectively and wiredly to the first pinhole terminals, the first integrated circuit chip including a main circuit unit including a first port unit that includes a number (M) of first ports, where $N-M \geqq 2$, and a second port unit that includes a number (P) of second ports, where $P \leqq N$, a pin transmission unit coupled between the first port unit of the main circuit unit, and the first solder pad unit, a pinhole transmission unit coupled between the second port unit of the main circuit unit, and the second solder pad unit, and a control unit coupled to the pin transmission unit, the pinhole transmission units and the first solder pad unit, and operable so as to control operation of the pin and pinhole transmission units such that each of the first ports of the main circuit unit is coupled to a selected one of the first solder pads of the first solder pad unit through the pin transmission unit, and that each of the second ports of the main circuit unit is coupled to a selected one of the second solder pads of the second solder pad unit through the pinhole transmission unit.

The second integrated circuit package includes a second substrate disposed on the first cover plate of the first integrated circuit package, provided with a number (N') of second pin terminals thereon, where $N' \leqq N$, each of the second pin terminals extending respectively through a corresponding first through hole in the first cover plate of the first integrated circuit package so as to contact electrically the first pinhole terminal in the corresponding first through hole, and a second integrated circuit chip associated with the first integrated circuit chip of the first integrated circuit package, mounted on the second substrate, and coupled wiredly to the second pin terminals such that the second integrated circuit chip is coupled to the main circuit unit of the first integrated circuit chip of the first integrated circuit package through the second pin terminals, the corresponding first pinhole terminals in the first cover plate of the first integrated circuit package, and the corresponding second solder pads and the pinhole transmission unit of the first integrated circuit chip of said first integrated circuit package.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
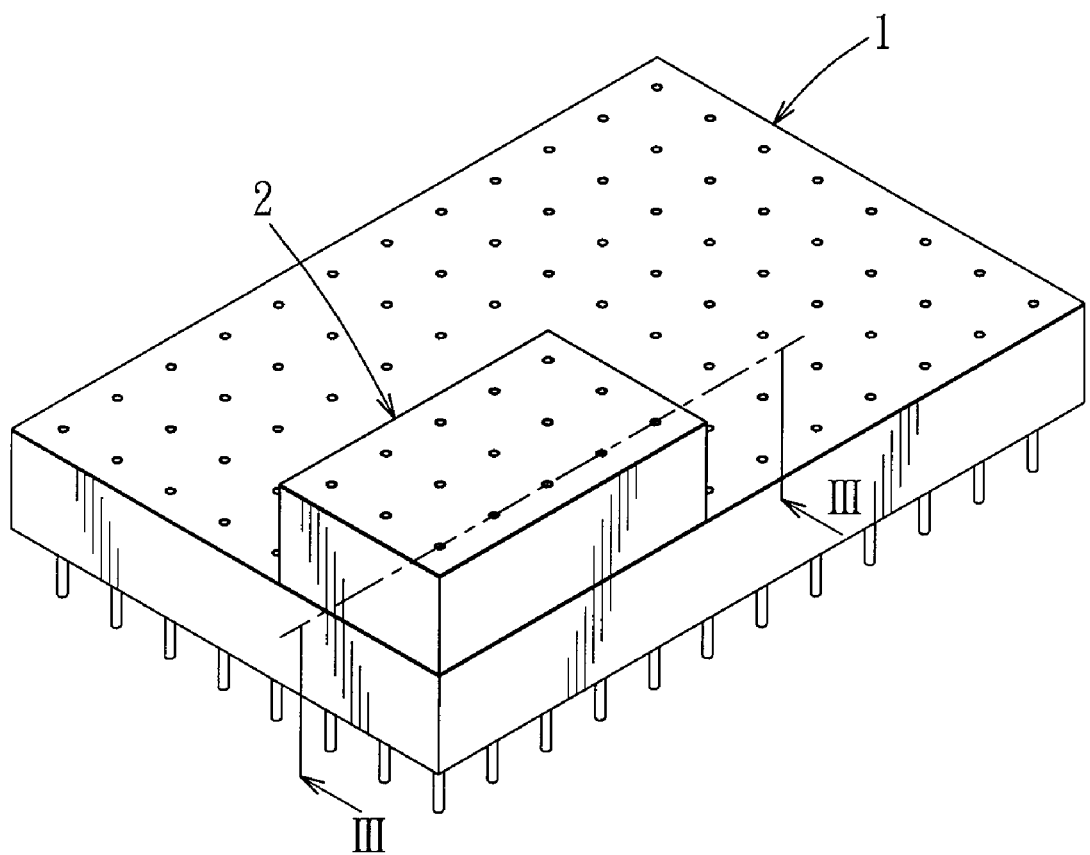
FIG. 1 is a perspective view showing the preferred embodiment of an integrated circuit package according to the present invention.
Figure 2:
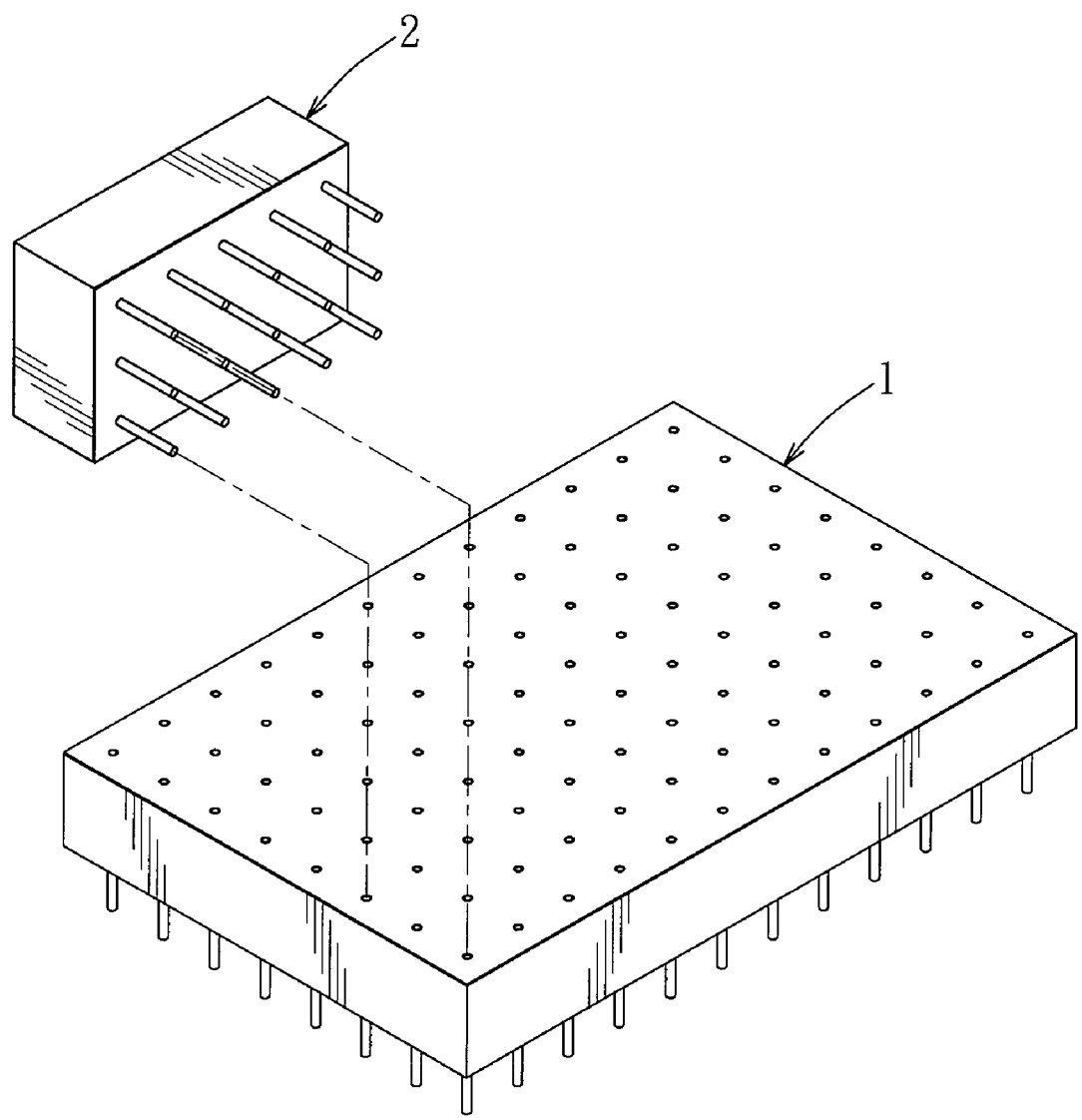
FIG. 2 is an exploded perspective view showing the preferred embodiment.
Figure 3:
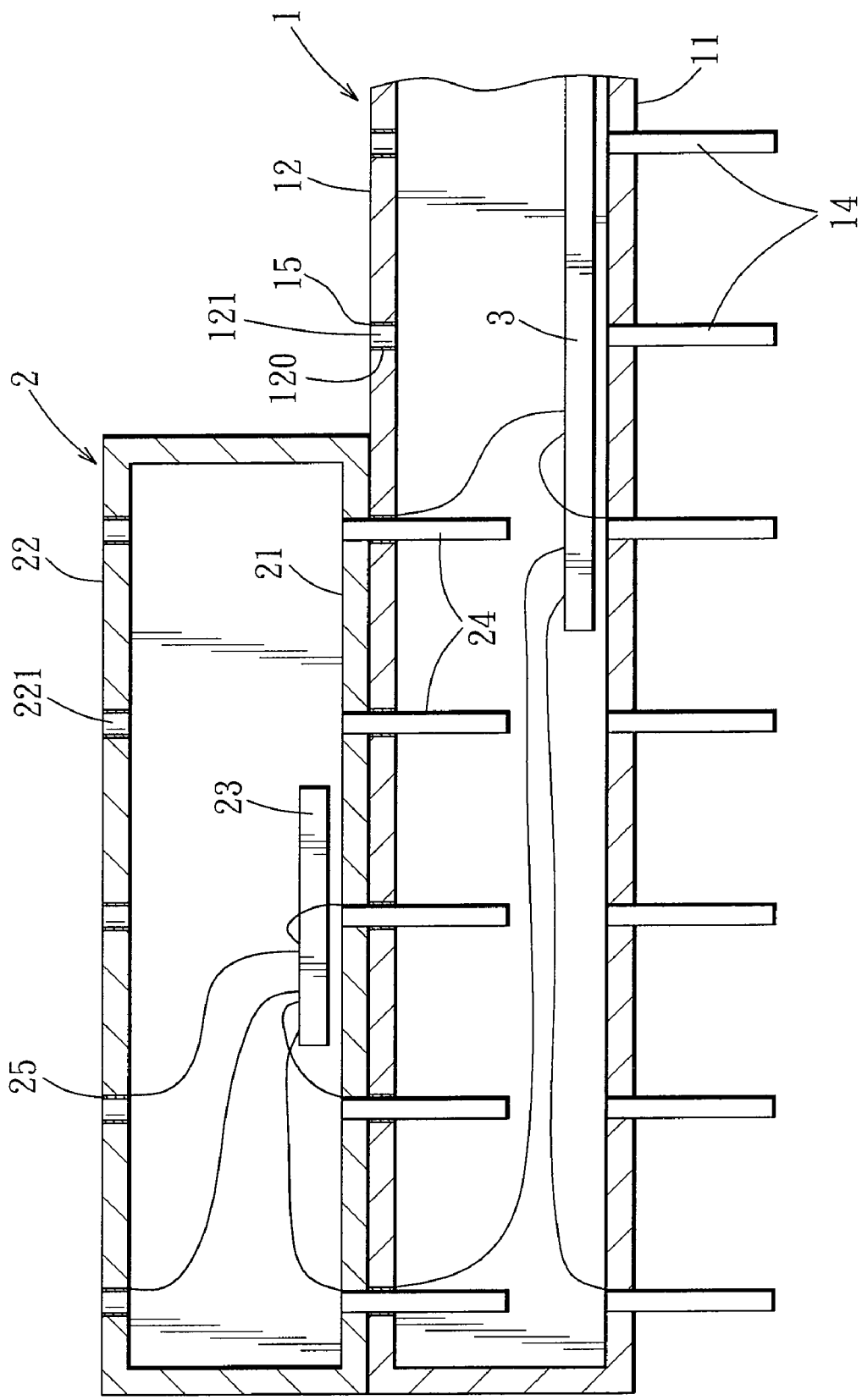
FIG. 3 is a schematic sectional view of FIG. 1 taken along line III-III.

Referring to FIGS. 1 to 3, the preferred embodiment of an integrated circuit package assembly according to the present invention is shown to include a first integrated circuit package 1, and a second integrated circuit package 2 stacked detachably on and coupled to the first integrated circuit package 1.

The first integrated circuit package 1 includes a first substrate 11, a first cover plate 12, and a first integrated circuit chip 3.

The first substrate 11 is provided with a number (N) of first pin terminals 14 thereon. The first pin terminals 14 extend outwardly of the first substrate 11. In this embodiment, the first pin terminals 14 are arranged in an array, such as an 8×12 array.

The first cover plate 12 is disposed on the first substrate 11, and is formed with a number (N) of first through holes 121 corresponding respectively to the first pin terminals 14. Each first through hole 121 is provided with a first pinhole terminal 15 therein. In this embodiment, the first through holes 121 are arranged in an array, such as an 8×12 array. Each first through hole 121 is defined by an annular inner wall 120. Each first pinhole terminal 15 is in the form of a conductive layer attached on a corresponding annular inner wall 120 of the first cover plate 12, as shown in FIG. 3.

Figure 4:
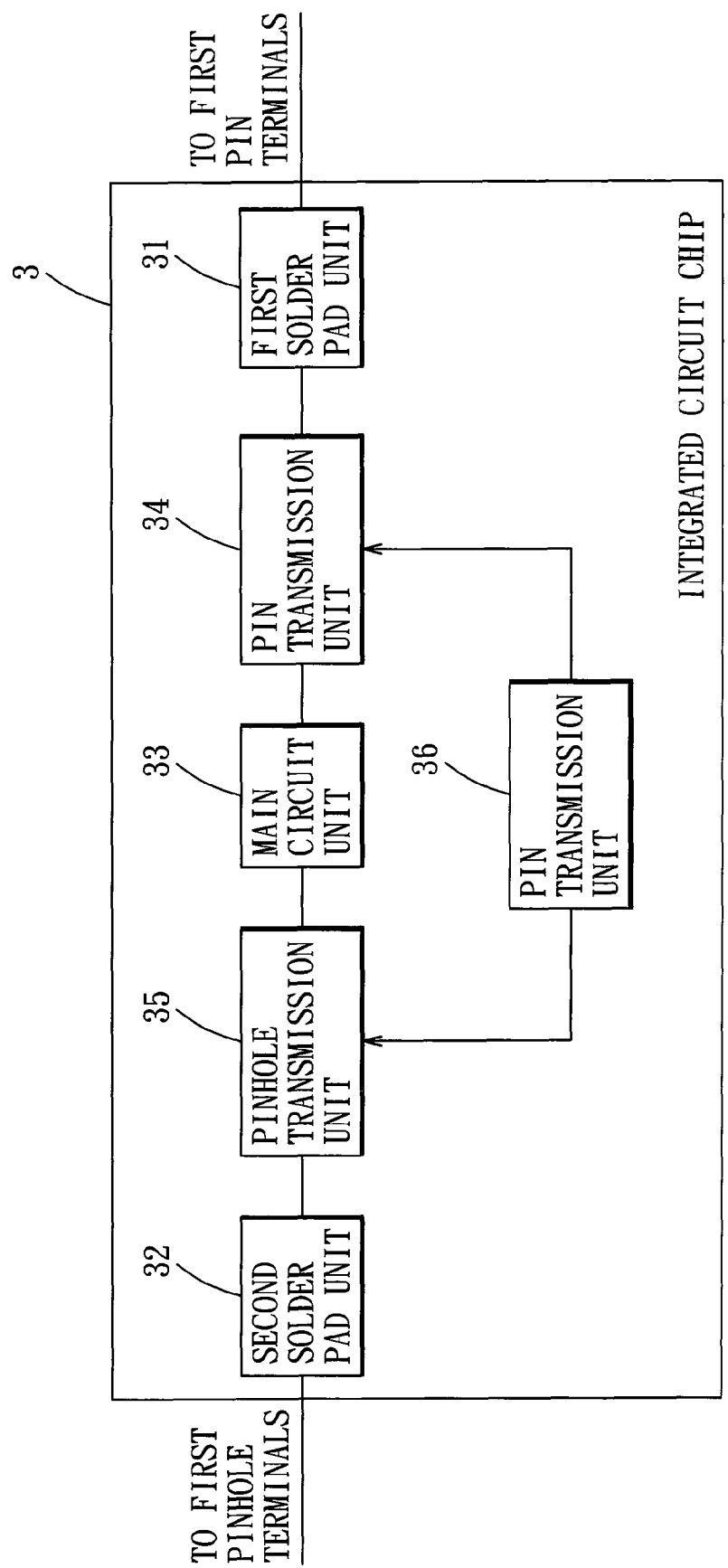
FIG. 4 is a schematic circuit block diagram illustrating an integrated circuit chip of the first integrated circuit package of the preferred embodiment.
Figure 5:
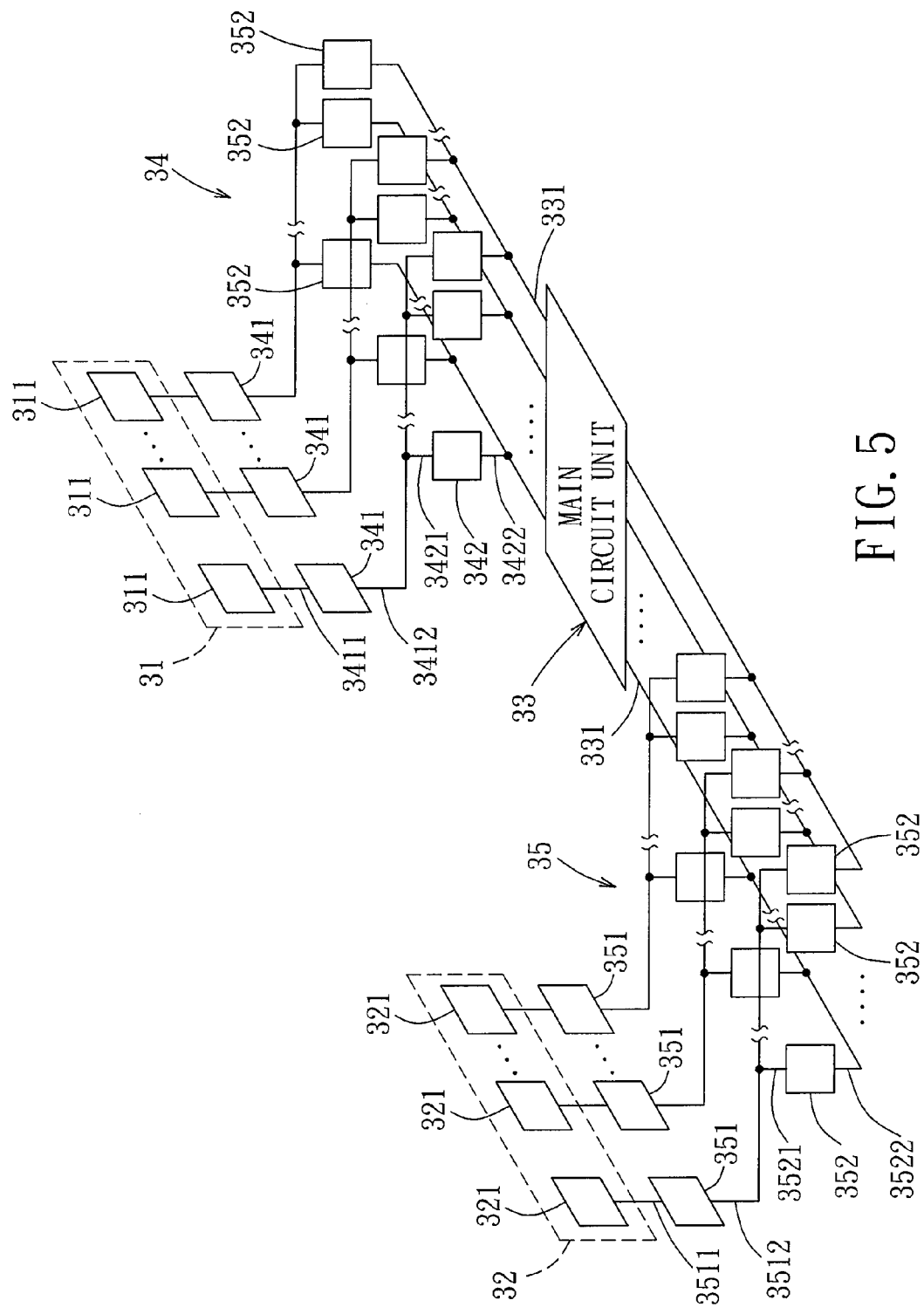
FIG. 5 is a diagram illustrating first and second solder pad units, pin and pinhole transmission units and a main circuit unit of the integrated circuit chip of the first integrated circuit package of the preferred embodiment.

Referring further to FIG. 4, the first integrated circuit chip 3 is mounted on the substrate 11, and is formed with a first solder pad unit 31 and a second solder pad unit 32. The first solder pad unit 31 includes a number (N) of first solder pads 311 coupled respectively and wiredly to the first pin terminals 14 through a lead frame (not shown). The second solder pad unit 32 includes a number (N) of second solder pads 321 coupled respectively and wiredly to the first pinhole terminals 15 through the lead frame.

The first integrated circuit chip 3 includes a main circuit unit 33, a pin transmission unit 34, a pinhole transmission unit 35, and a control unit 36.

The main circuit unit 33 includes a first port unit that includes a number (M) of first ports 331, where $N-M \geq 2$, and a second port unit that includes a number (P) of second ports 332, where $P \leq N$. In this embodiment, $N-M=2$, and $P=M$.

The pin transmission unit 34 is coupled between the first port unit of the main circuit unit 33, and the first solder pad unit 31. In this embodiment, the pin transmission unit 34 includes a number (N) of series connections. Each series connection has a first transmission gate 341, and a number (M) of second transmission gates 342, wherein the first transmission gate 341 has a first end 3411 coupled to a corresponding first solder pad 311 of the first solder pad unit 31, a second end 3412, and a control end that is omitted in FIG. 4 for the sake of simplicity, and wherein each second transmission gate 342 has a first end 3421 coupled to the second end 3412 of the first transmission gate 341, a second end 3422 coupled to a corresponding first port 331 of the main circuit unit 33, and a control end that is omitted in FIG. 4 for the sake of simplicity. The control end of each of the first and second transmission gates 341, 342 receives a control signal such that each of the first and second transmission gates 341, 342 is operable between an ON-mode and an OFF-mode in response to the control signal received thereby.

Similarly, as shown in FIG. 4, the pinhole transmission unit 35 is coupled between the second port unit of the main circuit unit 33, and the second solder pad unit 32. In this embodiment, the pinhole transmission unit 35 includes a number (N) of series connections. Each series connection has a third transmission gate 351, and a number (P) of fourth transmission gates 352, wherein the third transmission gate 351 has a first end 3511 coupled to a corresponding second solder pad 321 of the second solder pad unit 32, a second end 3512, and a control end that is omitted in FIG. 4 for the sake of simplicity, and wherein each fourth transmission gate 352 has a first end 3521 coupled to the second end 3512 of the third transmission gate 351, a second end 3522 coupled to a corresponding second port 332 of the main circuit unit 33, and a control end that is omitted in FIG. 4 for the sake of simplicity. The control end of each of the third and fourth transmission gates 351, 352 receives a control signal such that each of the third and fourth transmission gates 351, 352 is operable between an ON-mode and an OFF-mode based on the control signal received thereby. It is noted that, in this embodiment, each of the first, second, third and fourth transmission gates 341, 342, 351, 352 includes a CMOS transmission gate.

The control unit 36 is coupled to the pin transmission unit 34, the pinhole transmission unit 35, and is operable so as to control operation of the pin and pinhole transmission units 34, 35 such that each first port 331 of the main circuit unit 33 is coupled to a selected one of the first solder pads 311 of the first solder pad unit 31 through the pin transmission unit 34, and that each second port 332 of the main circuit unit 33 is coupled to a selected one of the second solder pads 321 of the second solder pad unit 32 through the pinhole transmission unit 35. In this embodiment, the control unit 36 is programmably configured to output respectively the control signals to the control ends of the first and second transmission gates 341, 342 of the pin transmission unit 34, and the control ends of the third and fourth transmission gates 351, 352 of the pinhole transmission unit 35 such that each of the first, second, third and fourth transmission gates 341, 342, 351, 352 is operated in one of the ON-mode and the OFF-mode in response to the control signal received thereby. It is noted that the control unit 36 includes two input ports (not shown), such as an enable port and a data port, each coupled to a respective first solder pad 311 of the first solder pad unit 31 for receiving a corresponding one of an enable signal and a data signal from an external device (not shown) through the corresponding pin terminal 14 upon reconfiguration.

The second integrated circuit package 2 includes a second substrate 21, a second cover plate 22, and a second integrated circuit chip 23.

The second substrate 21 is disposed on the first cover plate 12 of the first integrated circuit package 1, and is provided with a number (N') of second pin terminals 24 thereon, where $N' \leq N$. Each second pin terminal 24 extends respectively through a corresponding first through hole 121 in the first cover plate 12 of the first integrated circuit package 1 to contact electrically the first pinhole terminal 15 in the corresponding first through hole 121. In this embodiment, the second pin terminals 24 are arranged in an array, such as a 3×5 array. It is noted that a distance between any adjacent pair of the first pinhole terminals 15 of the first integrated circuit package 1 in each of a row direction and a column direction is equal to a distance between any adjacent pair of the second pin terminals 24 of the second integrated circuit package 2 in each of the row direction and the column direction.

The second cover plate 22 is disposed on the second substrate 21. In this embodiment, similar to the first cover plate 12 of the first integrated circuit package 1, the second cover plate 22 is provided with a number (N') of second pinhole terminals 25 in second through holes 221. The second pinhole terminals 25 correspond respectively to the second pin terminals 24. Each second through hole 221 is provided with a second pinhole terminal 25 therein. In this embodiment, the second through holes 221 are arranged in an array. Each second through hole 221 is defined by an annular inner wall 220. Each second pinhole terminal 25 is in the form of a conductive layer attached on a corresponding annular inner wall 220 of the second cover plate 22, as shown in FIG. 3.

The second integrated circuit chip 23 is associated with the first integrated circuit chip 3 of the first integrated circuit package 1, and is mounted on the second substrate 21. Similar to the first integrated circuit chip 3 of the first integrated circuit package 1, the second integrated circuit chip 23 has a plurality of solder pads (not shown) coupled respectively and wiredly to the second pin terminals 24 and the second pinhole terminals 25 through a lead frame (not shown). As a result, the second integrated circuit chip 23 is coupled to the main circuit unit 33 of the first integrated circuit chip 3 of the first integrated circuit package 1 through the second pin terminals 24, the corresponding first pinhole terminals 15 in the first cover plate 12 of the first integrated circuit package 1, and the corresponding second solder pads 321 and the pinhole transmission unit 35 of the first integrated circuit chip 3 of the first integrated circuit package 1. It is noted that, in the other embodiments, when a third integrated circuit package is to be stacked on and coupled to the second integrated circuit package 2, the second integrated circuit chip 23 can be designed to have a configuration corresponding to that of the first integrated circuit chip 3 of the first integrated circuit package 1. In other words, in addition to a main circuit unit and the solder pads, the second integrated circuit 23 can further include pin and pinhole transmission units, and a control unit similar to those of the first integrated circuit chip 3.

In sum, the integrated circuit package assembly of the present invention can be expanded in a vertical direction to form a multi-chip system with a minimized mounting area. Furthermore, since the second integrated circuit package 2 is stacked detachably on the first integrated circuit package 1, the first integrated circuit package 1 is permitted to connect electrically an integrated circuit package that has a function different from that of the second integrated circuit package 2 using redefinition of the pin terminals 14 and the pinhole terminals 15 of the first integrated circuit package 1 by means of the pin and pinhole transmission units 34, 35 and the control unit 36. Therefore, the integrated circuit package assembly of the present invention has flexibility during use.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An integrated circuit package comprising:
a substrate provided with a number (N) of pin terminals thereon, said pin terminals extending outwardly of said substrate;
a cover plate disposed on said substrate and provided with a number (N) of pinhole terminals therein; and
an integrated circuit chip mounted on said substrate, and formed with a first solder pad unit that includes a number (N) of first solder pads coupled respectively and wiredly to said pin terminals, and a second solder pad unit that includes a number (N) of second solder pads coupled respectively and wiredly to said pinhole terminals, said integrated circuit chip including
a main circuit unit including a first port unit that includes a number (M) of first ports, where $N-M \geq 2$, and a second port unit that includes a number (P) of second ports, where $P \leq N$,
a pin transmission unit coupled between said first port unit of said main circuit unit, and said first solder pad unit,
a pinhole transmission unit coupled between said second port unit of said main circuit unit, and said second solder pad unit, and
a control unit coupled to said pin transmission unit, said pinhole transmission units and said first solder pad unit, and operable so as to control operation of said pin and pinhole transmission units such that each of said first ports of said first port unit of said main circuit unit is coupled to a selected one of said first solder pads of said first solder unit through said pin transmission unit, and that each of said second ports of said second port unit of said main circuit unit is coupled to a selected one of said second solder pads of said second solder pad unit through said pinhole transmission unit.

2. The integrated circuit package as claimed in claim 1, wherein:
said pin transmission unit includes a number (N) of series connections each having
a first transmission gate having a first end coupled to a corresponding first solder pad of said first solder pad unit, a second end, and a control end coupled to said control unit, and
a number (M) of second transmission gates each having a first end coupled to said second end of said first transmission gate, a second end coupled to a corresponding first port of said main circuit unit, and a control end coupled to said control unit,
said control end of each of said first and second transmission gates of said first transmission unit receiving a control signal from said control unit such that each of said first and second transmission gates of said first transmission unit is operated in one of an ON-mode and an OFF-mode in response to the control signal received thereby; and
said pinhole transmission unit includes a number (N) of series connections each having
a third transmission gate having a first end coupled to a corresponding second solder pad of said second solder pad unit, a second end, and a control end coupled to said control unit, and
a number (P) of fourth transmission gates each having a first end coupled to said second end of said third transmission gate, a second end coupled to a corresponding second port of said main circuit unit, and a control end coupled to said control unit, said control end of each of said third and fourth transmission gates of said pinhole transmission unit receiving a control signal from said control unit such that each of said third and fourth transmission gates of said pinhole transmission unit is operated in one of an ON-mode and an OFF-mode in response to the control signal received thereby.

3. The integrated circuit package as claimed in claim 2, wherein said control unit is programmably configured to output respectively the control signals to said control ends of said first and second transmission gates of said pin transmission unit, and said control ends of said third and fourth transmission gates of said pinhole transmission unit.

4. The integrated circuit package as claimed in claim 2, wherein each of said first, second, third and fourth transmission gates includes a CMOS transmission gate.

5. The integrated circuit package as claimed in claim 1, wherein said pinhole terminals are arranged in an array.

6. The integrated circuit package as claimed in claim 1, wherein said pin terminals are arranged in an array.

7. The integrated circuit package as claimed in claim 1, wherein:
said cover plate is formed with a plurality of through holes each defined by an annular inner wall; and
each of said pinhole terminals is in the form of a conductive layer attached on a corresponding annular inner wall of said cover plate.

8. An integrated circuit package assembly comprising:
a first integrated circuit package; and
a second integrated circuit package stacked detachably on and coupled to said first integrated circuit package;
wherein said first integrated circuit package includes
a first substrate provided with a number (N) of first pin terminals thereon, said first pin terminals extending outwardly of said first substrate,
a first cover plate disposed on said first substrate, and formed with a number (N) of first through holes each provided with a first pinhole terminal therein, and
a first integrated circuit chip mounted on said first substrate, and formed with a first solder pad unit that includes a number (N) of first solder pads coupled respectively and wiredly to said first pin terminals, and a second solder pad unit that includes a number (N) of second solder pads coupled respectively and wiredly to said first pinhole terminals, said first integrated circuit chip including
a main circuit unit including a first port unit that includes a number (M) of first ports, where $N-M \geq 2$, and a second port unit that includes a number (P) of second ports, where $P \leq N$,
a pin transmission unit coupled between said first port unit of said main circuit unit, and said first solder pad unit,
a pinhole transmission unit coupled between said second port unit of said main circuit unit, and said second solder pad unit, and
a control unit coupled to said pin transmission unit, said pinhole transmission units and said first solder pad unit, and operable so as to control operation of said pin and pinhole transmission units such that each of said first ports of said main circuit unit is coupled to a selected one of said first solder pads of said first solder pad unit through said pin transmission unit, and that each of said second ports of said main circuit unit is coupled to a selected one of said second solder pads of said second solder pad unit through said pinhole transmission unit; and wherein said second integrated circuit package includes
a second substrate disposed on said first cover plate of said first integrated circuit package, provided with a number (N') of second pin terminals thereon, where $N' \leq N$, each of said second pin terminals extending respectively through a corresponding first through hole in said first cover plate of said first integrated circuit package so as to contact electrically said first pinhole terminal in the corresponding first through hole in said first cover plate of said first integrated circuit package, and
a second integrated circuit chip associated with said first integrated circuit chip of said first integrated circuit package, mounted on said second substrate, and coupled wiredly to said second pin terminals such that said second integrated circuit chip is coupled to said main circuit unit of said first integrated circuit chip of said first integrated circuit package through said second pin terminals, the corresponding first pinhole terminals in said first cover plate of said first integrate circuit package, and the corresponding second solder pads and said pinhole transmission unit of said first integrated circuit chip of said first integrated circuit package.

9. The integrated circuit package assembly as claimed in claim 8, wherein:
said pin transmission unit of said first integrated circuit chip of said first integrated circuit package includes a number (N) of series connections each having
a first transmission gate having a first end coupled to a corresponding first solder pad of said first solder pad unit, a second end, and a control end coupled to said control unit, and
a number (M) of second transmission gates each having a first end coupled to said second end of said first transmission gate, a second end coupled to a corresponding first port of said main circuit unit, and a control end coupled to said control unit,
said control end of each of said first and second transmission gates of said first transmission unit receiving a control signal from said control unit such that each of said first and second transmission gates of said pin transmission unit is operated in one of an ON-mode and an OFF-mode in response to the control signal received thereby; and
said pinhole transmission unit of said first integrated circuit chip of said first integrated circuit package includes a number (N) of series connections each having
a third transmission gate having a first end coupled to a corresponding second solder pad of said second solder pad unit, a second end, and a control end coupled to said control unit, and
a number (P) of fourth transmission gates each having a first end coupled to said second end of said third transmission gate, a second end coupled to a corresponding second port of said main circuit unit, and a control end coupled to said control unit,
said control end of each of said third and fourth transmission gates of said pinhole transmission unit receiving a control signal from said control unit such that each of said third and fourth transmission gates of said pinhole transmission unit is operated in one of an ON-mode and an OFF-mode in response to the control signal received thereby.

10. The integrated circuit package assembly as claimed in claim 9, wherein said control unit of said first integrated circuit chip of said first integrated circuit package is programmably configured to output respectively the control signals to said control ends of said first and second transmission gates of said pin transmission unit, and said control ends of said third and fourth transmission gates of said pinhole transmission unit.

11. The integrated circuit package assembly as claimed in claim 9, wherein each of said first, second, third and fourth transmission gates of said pin and pinhole transmission units of said first integrated circuit chip of said first integrated circuit package includes a CMOS transmission gate.

12. The integrated circuit package assembly as claimed in claim 8, wherein:
said first pinhole terminals of said first integrated circuit package are arranged in an array; and
said second pin terminals of said second integrated circuit package are arranged in an array.

13. The integrated circuit package assembly as claimed in claim 8, wherein said first pin terminals of said first integrated circuit package are arranged in an array.

14. The integrated circuit package assembly as claimed in claim 1, wherein:
each of said first through holes in said first cover plate of said first integrated circuit package is defined by an annular inner wall; and
each of said first pinhole terminals of said first integrated circuit package is in the form of a conductive layer attached on a corresponding annular inner wall of said first cover plate.

* * * * *